(12) United States Patent
Thurgood

(10) Patent No.: US 7,573,125 B2
(45) Date of Patent: Aug. 11, 2009

(54) METHODS FOR REDUCING STRESS IN MICROELECTRONIC DEVICES AND MICROELECTRONIC DEVICES FORMED USING SUCH METHODS

(75) Inventor: Blaine Thurgood, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 353 days.

(21) Appl. No.: 11/153,529

(22) Filed: Jun. 14, 2005

(65) Prior Publication Data

US 2006/0278969 A1    Dec. 14, 2006

(51) Int. Cl.
*H01L 23/02* (2006.01)
(52) U.S. Cl. ................. 257/678; 257/684; 257/E23.001
(58) Field of Classification Search .................. 257/687, 257/678, 783, 684, 685, E23.001, E23.003
See application file for complete search history.

(56) References Cited

U.S. PATENT DOCUMENTS

| | | | |
|---|---|---|---|
| 5,627,407 A | 5/1997 | Suhir et al. | |
| 6,258,624 B1 | 7/2001 | Corisis | |
| 6,294,831 B1 | 9/2001 | Shishido et al. | |
| 6,313,522 B1 | 11/2001 | Akram et al. | |
| 6,696,748 B1 | 2/2004 | Thurgood | |
| 6,855,574 B2 | 2/2005 | Thurgood | |
| 7,101,731 B2* | 9/2006 | Karnezos | 438/107 |
| 2002/0173074 A1* | 11/2002 | Chun-Jen et al. | 438/108 |
| 2002/0195699 A1* | 12/2002 | Akram et al. | 257/687 |
| 2004/0016939 A1* | 1/2004 | Akiba et al. | 257/126 |
| 2006/0108666 A1* | 5/2006 | Koizumi | 257/621 |

* cited by examiner

*Primary Examiner*—Hoai V Pham
(74) *Attorney, Agent, or Firm*—Perkins Coie LLP

(57) ABSTRACT

Methods for reducing stress in microelectronic devices and microelectronic devices formed using such methods are disclosed herein. One such device can include a first support member, a second support member, and a microelectronic die positioned between the first support member and the second support member such that the second support member at least approximately completely covers a surface of the die. The die is in intimate contact with both the first support member and the second support member and electrically coupled to at least one of the first support member and the second support member. The device further includes a fill material between the first and second support members and at least partially encapsulating the die. The second support member has structural material characteristics that are closer to those of the first support member than to the structural material characteristics of the fill material.

30 Claims, 3 Drawing Sheets

METHODS FOR REDUCING STRESS IN MICROELECTRONIC DEVICES AND MICROELECTRONIC DEVICES FORMED USING SUCH METHODS

TECHNICAL FIELD

The present invention is related to methods for reducing stress in microelectronic devices and microelectronic devices formed using such methods.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The dies are then separated from one another (i.e., singulated) by dicing the wafer and backgrinding the individual dies. After the dies have been singulated, they are typically "packaged" to couple the bond-pads to a larger array of electrical terminals that can be more easily coupled to the various power supply lines, signal lines, and ground lines.

An individual die can be packaged by electrically coupling the bond-pads on the die to arrays of pins, ball-pads, or other types of electrical terminals, and then encapsulating the die to protect it from environmental factors (e.g., moisture, particulates, static electricity, and physical impact). In one application, the bond-pads are electrically connected to contacts on an interposer substrate that has an array of ball-pads. FIG. 1A schematically illustrates a packaged microelectronic device 10 including an interposer substrate 20 having an array of ball-pads 22 and a microelectronic die 30 attached to the interposer substrate 20. The microelectronic die 30 has been encapsulated with a casing 40 to protect the die 30 from environmental factors.

One drawback of this conventional arrangement is that stresses within the device 10 can cause bowing or warpage of the device after encapsulation. FIG. 1B, for example, is a highly exaggerated view of the device 10 after the device has bowed. The bowing can be caused by several factors, such as asymmetrical stress distribution within the device caused by the difference between the coefficients of thermal expansion of the interposer substrate 20, the microelectronic die 30, and the casing 40. The warpage of the interposer substrate 20 can cause failure in solder links between the interposer substrate 20 and a printed circuit board (not shown) to which the interposer substrate 20 is attached or delamination between the die 30, the interposer substrate 20, and/or the casing 40. Accordingly, there is a need to reduce stresses in microelectronic devices.

DETAILED DESCRIPTION

A. Overview/Summary

Figure 1A:
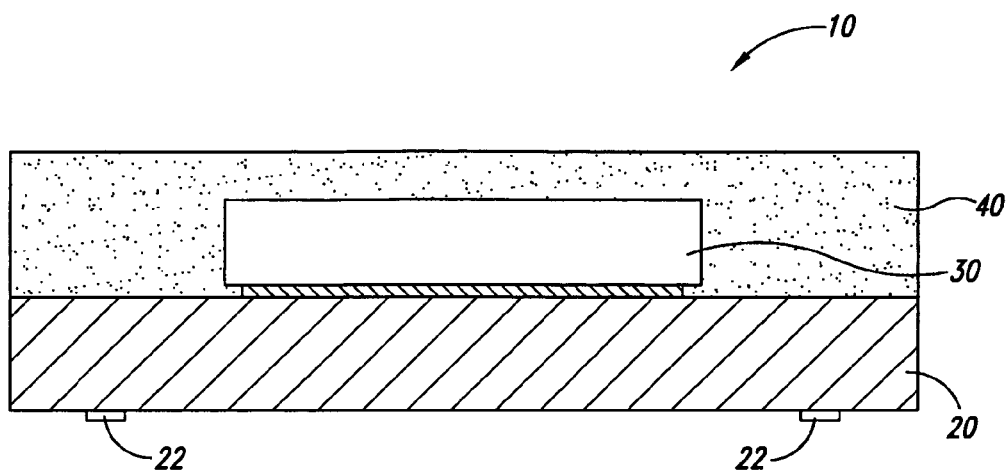
FIG. 1A is a partially schematic side cross-sectional view of a packaged microelectronic device including an interposer substrate and a microelectronic die in accordance with the prior art.

The present invention relates generally to methods for reducing stress in microelectronic devices and microelectronic devices formed using such methods. One such device can include a first support member, a second support member, and a microelectronic die positioned between the first support member and the second support member such that the second support member at least approximately completely covers a surface of the die. The die is in intimate contact with both the first support member and the second support member and is electrically coupled to at least one of the first support member and the second support member. In particular embodiments, the device can include a chip-on-board configuration, a flip-chip configuration, or a board-on-chip configuration. The device further includes a fill material between the first and second support members that at least partially encapsulates the die. The second support member has structural material characteristics that are closer to those of the first support member than to the structural material characteristics of the fill material. In several embodiments, for example, the first support member and the second support member can have generally similar coefficients of thermal expansion and/or modulus.

A packaged microelectronic device in accordance with another embodiment can include a first support member having support member circuitry and a second support member having a generally uniform thickness throughout. A microelectronic die is positioned between the first support member and the second support member and is electrically coupled to the support member circuitry. The die is carried by both the first support member and the second support member. The device also includes a fill material between the first and second support members that at least partially encapsulates the die. The second support member has material characteristics that are closer to those of the first support member than the material characteristics of the fill material.

A method for packaging a microelectronic device in accordance with another embodiment of the invention includes attaching a first side of a microelectronic die to a first support member and coupling a second support member to a second side of the die opposite the first side of the die such that the second support member completely covers the die. The die is electrically coupled to at least one of the first support member and the second support member. The method also includes disposing a fill material between the first support member and the second support member to at least partially encapsulate the die. The second support member has material characteristics that are closer to those of the first support member than the material characteristics of the fill material.

The present disclosure describes methods packaging microelectronic devices and microelectronic devices formed using such methods. Many specific details of certain embodiments of the invention are set forth in the following description and in FIGS. 2-5 to provide a thorough understanding of these embodiments. One skilled in the art, however, will understand that the present invention may have additional embodiments, and that the invention can be practiced without several of the details described below.

Figure 2:
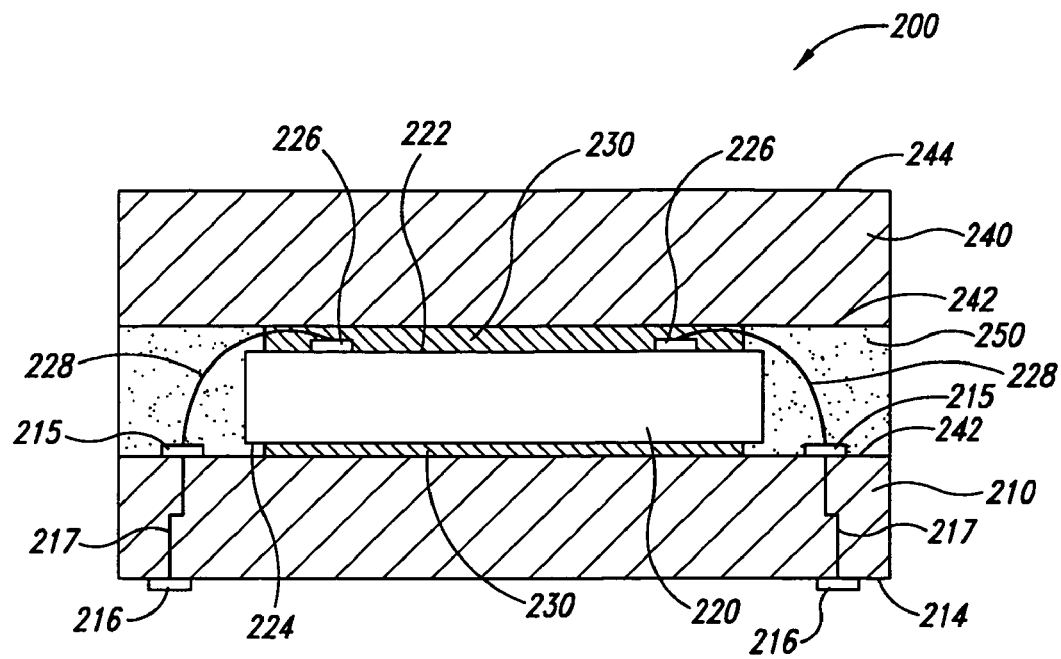
FIG. 2 is a partially schematic side cross-sectional view of a packaged microelectronic device in accordance with an embodiment of the invention.

B. Embodiments of Methods for Reducing Stress in Microelectronic Devices and Microelectronic Devices Formed Using Such Methods FIG. 2 is a side cross-sectional view of a packaged microelectronic device 200 configured in accordance with one embodiment of the invention. The microelectronic device 200 can include a first support member 210, a second support member 240, and a microelectronic die 220 positioned between the first support member 210 and the second support member 240. The microelectronic device 200 shown in FIG. 2 is expected to provide structural balance and symmetry to the stress distribution within the device, thereby resulting in less stress within the individual components of the device and the interfaces between the components.

The first support member 210 in the embodiment shown in FIG. 2 can include a first side 212 and a second side 214 opposite the first side 212. The first support member 210 can be a flexible material or a generally rigid material. In the illustrated embodiment, the first support member 210 is an interposing device that provides an array of ball-pads for coupling very small contacts on the microelectronic die 220 to another type of device. The first support member 210, for example, includes an array of support member terminals 215 on the first side 212, an array of contact pads (e.g., ball-pads) 216 on the second side 214, and a trace 217 or other type of conductive line between each terminal 215 and corresponding contact pad 216. The contact pads 216 are arranged in an array for surface mounting the device 200 to a board or module of another device.

The microelectronic die 220 includes an active side 222 and a back side 224 opposite the active side 222. In the illustrated embodiment, the back side 224 of the die 220 is attached to the first side 212 of the first support member 210 and the active side 222 is attached to the second support member 240 such that the device 200 has a chip-on-board (COB) configuration. The active side 222 and the back side 224 of the die 220 are attached to the first support member 210 and second support member 240, respectively, with an adhesive 230. The adhesive 230 can include epoxy, tape, or other suitable adhesive materials. In other embodiments, the die 220 may be attached to the first support member 210 and/or the second support member 240 using a molding compound, an underfill material, or another suitable material.

The microelectronic die 220 also includes integrated circuitry (not shown) and a plurality of terminals (e.g., bondpads) 226 electrically coupled to the integrated circuitry. The terminals 226 are arranged in an array along the active side 222 of the microelectronic die 220. The die 220 can be electrically coupled to at least one of the first support member 210 and the second support member 240. The device 200, for example, includes a plurality of wire bonds 228 or other types of connectors extending between the terminals 226 and corresponding support member terminals 215 on the first support member 210. As such, the first support member 210 distributes signals from the very small terminals 226 on the die 220 to the larger array of contact pads 216 on the second side 214 of the first support member 210. In the embodiment illustrated in FIG. 2, the die 220 is not electrically coupled to the second support member 240. In other embodiments, such as those described below with respect to FIG. 5, the die 220 is electrically coupled to both a first support member and a second support member.

The second support member 240 includes a first side 242 attached to the active side 222 of the die 220 and a second side 244 opposite the first side 242. The second support member 240 has a generally uniform thickness throughout such that it completely covers the die 220. The second support member 240 can be generally similar to the first support member 210. For example, the first support member 210 and the second support member 240 can have similar material properties, such as coefficient of thermal expansion (CTE) and/or modulus. In other embodiments, the second support member 240 may be an exact replica of the first support member 210, or the second support member 240 may be a different material type and construction than the first support member 210, so long as the first and second support members 210 and 240 have similar properties (e.g., CTE and/or modulus).

A fill material 250 can be deposited into the area around the periphery of the die 220 between the first support member 210 and the second support member 240. The fill material 250 enhances the integrity of the device 200 and protects the die 220, wire bonds 228, and terminals 215 from moisture, chemicals, and other contaminants. In one embodiment, the fill material 250 is a molding compound such as an epoxy resin. In other embodiments, the fill material 250 can include other suitable materials.

Figure 1B:
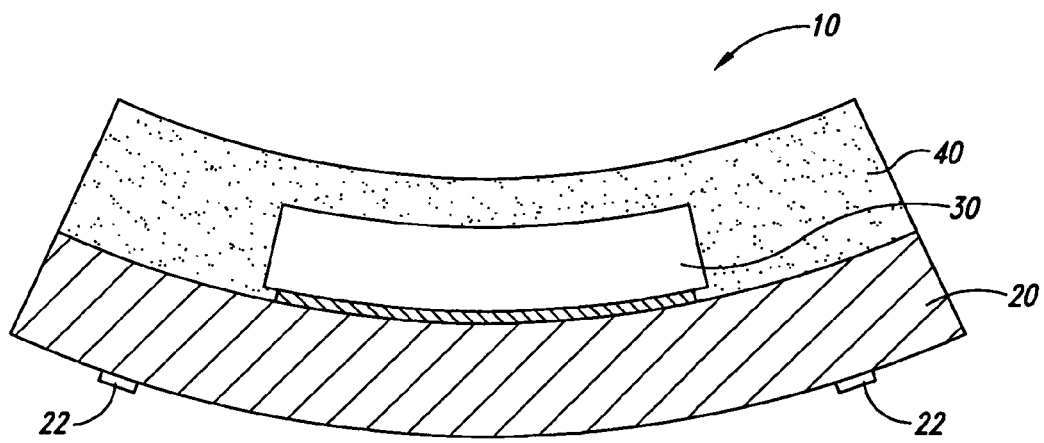
FIG. 1B is a partially schematic side cross-sectional view of the microelectronic device of FIG. 1A after bowing has occurred.

One feature of embodiments of the device 200 described above is that the first support member 210 and the second support member 240 have approximately equal footprints. The sandwich-type cross section provided by the first support member 210 and second support member 240 balances the device 200 so that stresses within the device are distributed symmetrically, resulting in fewer stress risers between the individual components of the device 200 and the interfaces between the various components. In conventional devices (FIGS. 1A and 1B), the asymmetrical stress distribution can cause warping and/or delamination between the substrate 20, the microelectronic die 30, and the casing 40. The balanced design of the device 200 shown in FIG. 2, however, can reduce and/or eliminate the tendency for the device 200 to warp or deform because the stress on one side of the device 200 offsets the stress on the other side.

Another feature of embodiments of the device 200 shown in FIG. 2 is that the balanced design of the device allows for a reduction in die-edge to package-edge spacing. In conventional devices, a significant amount of material is necessary outboard of the die to prevent bowing and/or warping of the device. In the device 200 shown in FIG. 2, however, the distance between the outboard edge of the die and the outboard edge of the package can be substantially less because the stresses are distributed more symmetrically throughout the entire device. Accordingly, the footprint of the device 200 can be significantly smaller than that of conventional devices.

Figure 3:
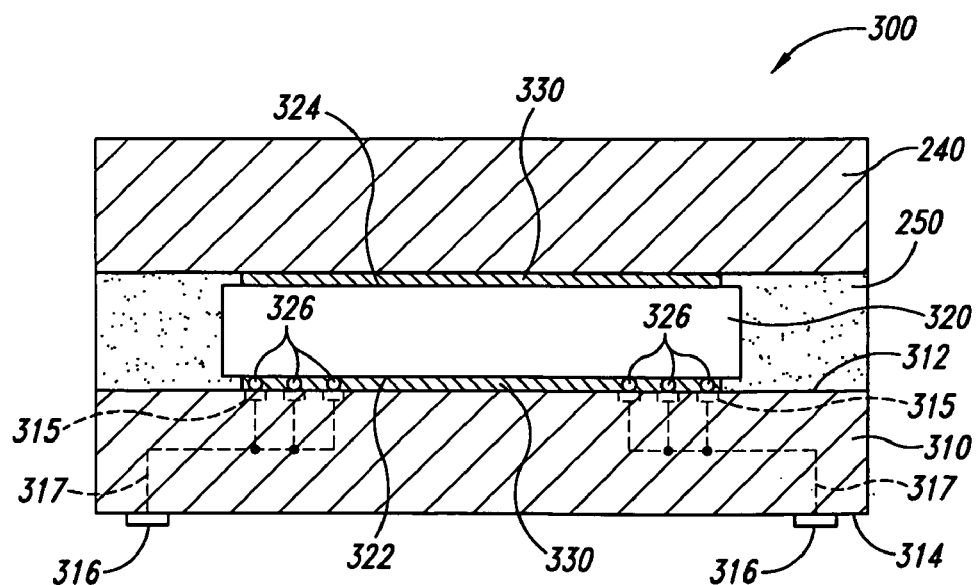
FIG. 3 is a partially schematic side cross-sectional view of a packaged microelectronic device in accordance with another embodiment of the invention.

FIG. 3 is a side cross-sectional view of a packaged microelectronic device 300 in accordance with another embodiment of the invention. The microelectronic device 300 differs from the device 200 of FIG. 2 in that the device 300 has a flip-chip (FCIP) configuration rather than the COB configuration of the device 200. The device 300 is expected to have many of the same advantages as the device 200 described previously.

The device 300 includes a first support member 310, the second support member 240, and a microelectronic die 320 positioned between the first support member 310 and the second support member 240. The die 320 is attached to both the first support member 310 and the second support member 240. The first support member 310 can be generally similar to the first support member 210 described above with respect to FIG. 2. The first support member 310, for example, includes a first side 312 and a second side 314 opposite the first side 312. The first support member 310 also includes an array of support member terminals 315 on the first side 312, an array of contact pads 316 on the second side 314, and support member circuitry (e.g., traces) 317 between each terminal 315 and corresponding contact pad 316. As described below, the terminals 315 are arranged on the first side 312 for connection to the die 320.

The microelectronic die 320 includes an active side 322 and a back side 324 opposite the active side 322. As mentioned above, the active side 322 of the die 320 is attached to the first side 312 of the first support member 310 in an FCIP configuration. The die 320 includes a plurality of terminals 326 electrically coupled to corresponding support member terminals 315 on the first support member 310. In the illustrated embodiment, the active side 322 and the back side 324 of the die 320 are attached to the first support member 310 and second support member 240, respectively, with an underfill 330. In other embodiments, the die 320 can be attached to the first support member 310 and/or the second support member 240 using an adhesive or another suitable material. The fill material 250 (described above with respect to FIG. 2) can be deposited into the area around the periphery of the die 320 between the first support member 310 and the second support member 240.

Figure 4:
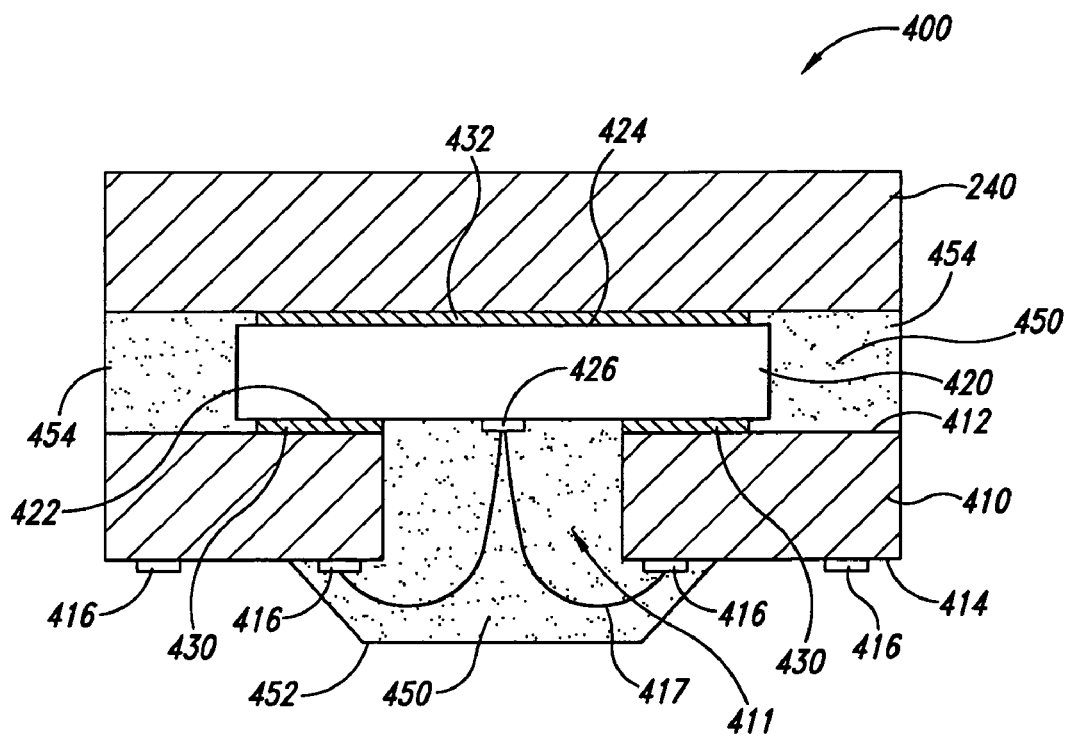
FIG. 4 is a partially schematic side cross-sectional view of a packaged microelectronic device in accordance with yet another embodiment of the invention.

FIG. 4 is a partially schematic side cross-sectional view of a packaged microelectronic device in accordance with yet another embodiment of the invention. The microelectronic device 400 differs from the device 200 of FIG. 2 and the device 300 of FIG. 3 in that the device 400 has a board-on-chip (BOC) configuration rather than the COB configuration of the device 200 or the FCIP configuration of the device 300. The device 400 is expected to have many of the same advantages as the devices 200 and 300 described above.

The device 400 in the embodiment shown in FIG. 4 includes a first support member 410, the second support member 240, and a microelectronic die 420 positioned between and attached to both the first support member 410 and the second support member 240. The first support member 410 can be generally similar to the first support member 210 described above with respect to FIG. 2, except that the first support member 410 includes a communication opening 411 extending completely through the first support member from a first side 412 to a second side 414 opposite the first side 412. The communication opening 411 extends lengthwise along a medial portion of the first support member 410. The first support member 410 also includes an array of contact pads 416 on the second side 414.

The microelectronic die 420 includes an active side 422 attached to the first support member 410 and a back side 424 opposite the active side 422. The die 420 further includes a plurality of terminals 426 arranged in an array along the active side 422 of the die 420. The device 400 can include a plurality of wire bonds 417 or other types of connectors extending between the terminals 426 and corresponding contact pads 416 on the first support member 410. Accordingly, the first support member 410 distributes signals from the very small terminals 426 on the die 420 to the larger array of contact pads 416 on the second side 414 of the first support member 410.

In the embodiment shown in FIG. 4, the active side 422 of the die 420 is attached to the first support member 410 with a first adhesive 430 and the back side 424 of the die 420 is attached to the second support member 240 with a second adhesive 432. The first and second adhesives 430 and 432 can be formed from similar materials as the adhesive 230 (FIG. 2), or the first and second adhesives 430 and 432 may include other suitable materials. The first and second adhesives 430 and 432 can include the same material, or the first and second adhesives 430 and 432 can include different materials. In other embodiments, the die 420 can be attached to the first support member 410 and the second support member 240 using molding compound, underfill, or other suitable materials.

The device 400 further includes a molding compound 450 encapsulating at least a portion of the die 420. The molding compound 450, for example, forms a first casing 452 over the communication opening 411, the wire bonds 417, the terminals 426 on the die 420, and at least a portion of the contact pads 416. In this way, the first casing 452 protects the various components from contamination and/or damage. A second casing 454 is formed in the area around the periphery of the die 420 between the first support member 410 and the second support member 240.

Figure 5:
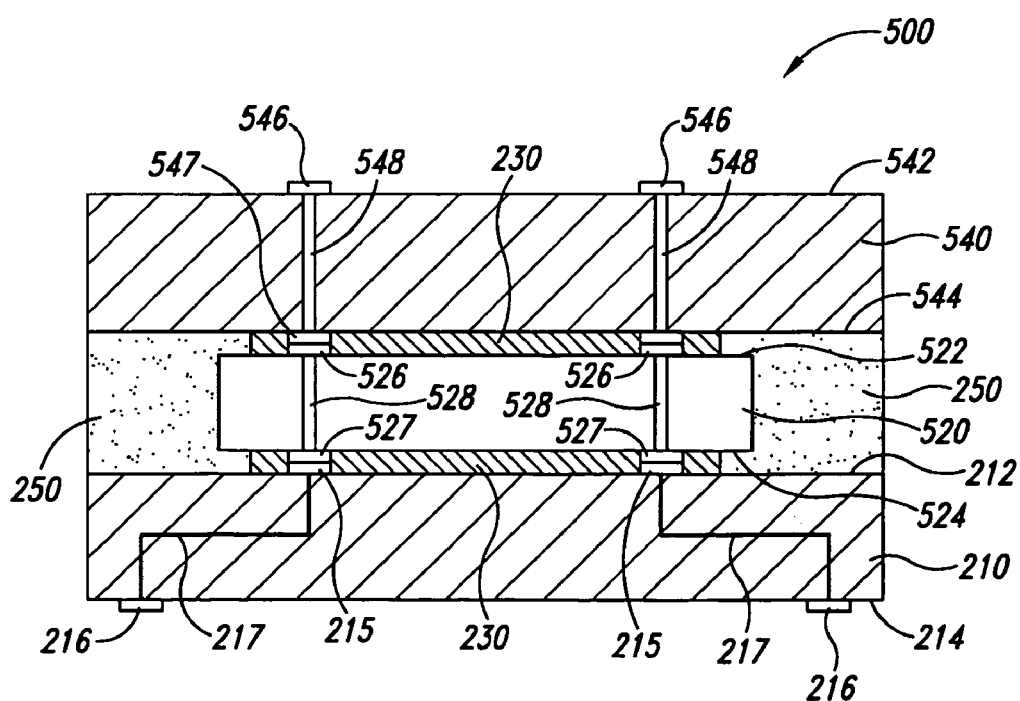
FIG. 5 is a partially schematic side cross-sectional view of a packaged microelectronic device in accordance with still another embodiment of the invention.

FIG. 5 is a partially schematic side cross-sectional view of a packaged microelectronic device 500 in accordance with still another embodiment of the invention. The device 500 is generally similar to the device 200 described above with respect to FIG. 2, except that the device 500 includes a die 520 electrically coupled to both the first support member 210 and a second support member 540. The device 500 is expected to have many of the same advantages as the devices described above with respect to FIGS. 2-4.

The die 520 includes a plurality of terminals 526 on a first side 522 of the die 520, an array of contact pads 527 on a second side 524 of the die 520, and interconnects 528 extending through the 520 electrically coupling the terminals 526 to corresponding contact pads 527. The second support member 540 includes an array of support member terminals 546 on a first side 542 of the second support member 540, an array of support member contact pads 547 on a second side 544 of the second support member, and a plurality of interconnects 548 extending through the second support member 540 to electrically couple support member terminals 546 to corresponding support member contact pads 547. The terminals 526 on the die 520 are electrically coupled to corresponding support member contact pads 547 on the second support member 540. In this way, the support member terminals 546 are in electrical contact with the contact pads 216 on the second side 214 of the first support member 210.

From the foregoing, it will be appreciated that specific embodiments of the invention have been described herein for purposes of illustration, but that various modifications may be made without deviating from the spirit and scope of the invention. For example, the microelectronic devices can have other configurations than those described above. In several embodiments, for example, one or more additional microelectronic dies can be stacked on the device 500 and electrically coupled to the die 520. The one or more additional dies can be positioned between additional support members such that the number of support members in the stacked device exceeds the number of dies by one. Aspects of the invention described in the context of particular embodiments may be combined or eliminated in other embodiments. For example, support members and/or adhesives described in the context of certain embodiments can be applied to other embodiments as well. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

I claim:

1. A packaged microelectronic device, comprising:
a first support member;
a second support member, wherein the first and second support members have approximately the same footprint;
a microelectronic die positioned between the first support member and the second support member with the second support member at least approximately completely covering a side of the die, wherein the die is in intimate contact with both the first support member and the second support member, and wherein the die is electrically coupled to the first support member and out of electrical contact with the second support member; and
a fill material between the first and second support members and at least partially encapsulating the die, wherein the second support member has structural material characteristics that are closer to those of the first support member than to the structural material characteristics of the fill material.

2. The microelectronic device of claim 1 wherein:
the first support member has a first side, a second side opposite the first side, a support member terminal proximate the first side, and a contact pad proximate the second side electrically coupled to the support member terminal; and
the die includes a terminal electrically coupled to the contact pad.

3. The microelectronic device of claim 2 wherein:
the die includes an active side and a back side opposite the active side, the back side facing the first support member; and
the terminal is proximate the active side of the die and is electrically coupled to the support member terminal proximate the first side of the support member.

4. The microelectronic device of claim 2 wherein:
the die includes an active side facing the first support member and a back side opposite the active side; and
the terminal is proximate the active side of the die and is electrically coupled to the support member terminal proximate the first side of the first support member.

5. The microelectronic device of claim 2 wherein:
the first support member includes a communication slot extending lengthwise along a medial portion of the first support member;
the die includes an active side facing the first support member and a back side opposite the active side, the terminal being proximate the active side; and
the microelectronic device further comprises a plurality of wire bonds extending at least partially through the communication slot and electrically coupling the terminal to the contact pad.

6. The microelectronic device of claim 1 wherein:
the die includes a first side and a second side opposite the first side; and
the first side of the die is in intimate contact with the first support member and the second side of the die is in intimate contact with the second support member, the second support member at least approximately covering the second side of the die.

7. The microelectronic device of claim 1 wherein the die is attached to the first support member and the second support member with an adhesive, the fill material, or both.

8. The microelectronic device of claim 1 wherein the die is attached to the first support member with a first adhesive and the die is attached to the second support member with a second adhesive.

9. The microelectronic device of claim 1 wherein the number of support members exceeds the number of dies by one.

10. The microelectronic device of claim 1 wherein the first support member and the second support member have approximately the same coefficient of thermal expansion (CTE), modulus, or both.

11. The microelectronic device of claim 1 wherein the first support member and the second support member are at least approximately identical.

12. The microelectronic device of claim 1 wherein the second support member has a generally uniform thickness throughout.

13. A packaged microelectronic device, comprising:
a first support member having support member circuitry, wherein the first support member has a first footprint;
a second support member having a generally uniform thickness throughout, wherein the second support member has a second footprint approximately the same as the first footprint;
a microelectronic die positioned between the first support member and the second support member and carried by both the first support member and the second support member, the die being electrically coupled to the support member circuitry and not electrically coupled to the second support member; and
a fill material between the first and second support members and at least partially encapsulating the die, wherein the second support member has structural material characteristics that are closer to those of the first support member than to the structural material characteristics of the fill material.

14. The microelectronic device of claim 13 wherein:
the first support member has a first side and a second side opposite the first side, and wherein the support member circuitry includes a plurality of support member terminals proximate the first side, a plurality of contact pads proximate the second side, and traces electrically coupling support member terminals to corresponding contact pads; and
the die includes a plurality of terminals electrically coupled to corresponding contact pads.

15. The microelectronic device of claim 14 wherein:
the die includes an active side and a back side opposite the active side, the back side facing the first support member; and
the plurality of terminals are proximate the active side of the die and electrically coupled to corresponding support member terminals proximate the first side of the support member.

16. The microelectronic device of claim 14 wherein:
the die includes an active side facing the first support member and a back side opposite the active side; and
the plurality of terminals are proximate the active side of the die and electrically coupled to corresponding support member terminals proximate the first side of the support member.

17. The microelectronic device of claim 14 wherein:
the first support member includes a communication slot extending lengthwise along a medial portion of the first support member;
the die includes an active side facing the first support member and a back side opposite the active side, the plurality of terminals being proximate the active side; and
the microelectronic device further comprises a plurality of wire bonds extending through the slot and electrically coupling the terminals to corresponding contact pads proximate the second side of the support member.

18. The microelectronic device of claim 13 wherein the die is attached to the first support member and the second support member with an adhesive, the fill material, or both.

19. The microelectronic device of claim 13 wherein the number of support members exceeds the number of dies by one.

20. The microelectronic device of claim 13 wherein the first support member and the second support member have approximately the same CTE, modulus, or both.

21. The microelectronic device of claim 13 wherein the first support member and the second support member are at least approximately identical.

22. The microelectronic device of claim 13 wherein the second support member at least approximately completely covers a side of the die.

23. A packaged microelectronic device, comprising:
a first substrate having a first side, a second side opposite the first side, a plurality of first terminals proximate the first side, and a plurality of contact pads proximate the second side electrically coupled to corresponding first terminals;
a second substrate;
a microelectronic die positioned between the first substrate and the second substrate and in intimate contact with both the first substrate and the second substrate, the die including a plurality of second terminals electrically coupled to corresponding contact pads, wherein the second substrate at least approximately completely covers a surface of the die, and wherein the die is not electrically coupled to the second substrate; and
a fill material between the first and second substrates and at least partially encapsulating the die.

24. The microelectronic device of claim 23 wherein the second substrate has structural material characteristics that are closer to those of the first substrate than to the structural material characteristics of the fill material.

25. The microelectronic device of claim 23 wherein the die is attached to the first substrate and the second substrate with an adhesive, the fill material, or both.

26. The microelectronic device of claim 23 wherein the first substrate and the second substrate have approximately the same CTE, modulus, or both.

27. The microelectronic device of claim 23 wherein the first substrate and the second substrate are at least approximately identical.

28. A packaged microelectronic device, comprising:
a microelectronic die having a first side, a second side opposite the first side, an integrated circuit, and a terminal electrically coupled to the integrated circuit;
a primary substrate coupled to the first side of the die, the primary substrate having a contact pad electrically coupled to the terminal on the die;
a secondary substrate coupled to the second side of the die and at least approximately completely covering the second side of the die, wherein the die is not electrically coupled to the secondary substrate; and
a fill material between the primary substrate and the secondary substrate and at least partially encapsulating the die, wherein the secondary substrate has structural material characteristics that are closer to those of the primary substrate than to the structural material characteristics of the fill material.

29. The microelectronic device of claim 28 wherein the primary substrate and the secondary substrate have approximately the same CTE, modulus, or both.

30. The microelectronic device of claim 28 wherein the primary substrate and the second substrate are at least approximately identical.

* * * * *

UNITED STATES PATENT AND TRADEMARK OFFICE
CERTIFICATE OF CORRECTION

PATENT NO. : 7,573,125 B2
APPLICATION NO. : 11/153529
DATED : August 11, 2009
INVENTOR(S) : Blaine Thurgood It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 641 days.

Signed and Sealed this

Seventh Day of September, 2010

David J. Kappos
*Director of the United States Patent and Trademark Office*